(12) United States Patent
Bae et al.

(10) Patent No.: US 10,665,549 B2
(45) Date of Patent: May 26, 2020

(54) FAN-OUT SEMICONDUCTOR PACKAGE

(71) Applicant: SAMSUNG ELECTRONICS CO., LTD., Suwon-si (KR)

(72) Inventors: Sung Hawn Bae, Suwon-si (KR); Jung Soo Kim, Suwon-si (KR); Won Choi, Suwon-si (KR); Sung Hoan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/268,874

(22) Filed: Feb. 6, 2019

(65) Prior Publication Data
US 2020/0051918 A1   Feb. 13, 2020

(30) Foreign Application Priority Data
Aug. 7, 2018   (KR) .......................... 10-2018-0091938

(51) Int. Cl.
*H01L 23/52*   (2006.01)
*H01L 23/31*   (2006.01)
(Continued)

(52) U.S. Cl.
CPC ...... *H01L 23/5386* (2013.01); *H01L 23/3128* (2013.01); *H01L 23/5226* (2013.01);
(Continued)

(58) Field of Classification Search
CPC ............. H01L 23/5386; H01L 23/3128; H01L 23/5226; H01L 23/5383
(Continued)

(56) References Cited

U.S. PATENT DOCUMENTS 8,097,490 B1 *   1/2012   Pagaila ................. H01L 21/561
                                                        438/106
9,099,455 B2     8/2015   Chow et al.
(Continued)

FOREIGN PATENT DOCUMENTS

| KR | 10-2006-0113412 A | 11/2006 |
| KR | 10-2018-0031244 A | 3/2018 |
| KR | 10-2018-0032148 A | 3/2018 |

OTHER PUBLICATIONS

Communication dated Oct. 1, 2019, issued by the Korean Patent Office in counterpart Korean Application No. 10-2018-0091938.
(Continued)

*Primary Examiner* — Sheikh Maruf
(74) *Attorney, Agent, or Firm* — Sughrue Mion, PLLC

(57) ABSTRACT

A fan-out semiconductor package includes: a frame, including a wiring layer, and having a through-hole; a semiconductor chip disposed in the through-hole, and including a connection pad; an encapsulant covering at least a portion of each of the frame and an inactive surface of the semiconductor chip, and having a first opening exposing at least a portion of the wiring layer; an insulating layer disposed on the encapsulant, and having a second opening formed in the first opening to expose at least a portion of the wiring layer; a conductive pattern layer disposed on the insulating layer; a conductive via disposed in the second opening; and a connection structure disposed on the frame and an active surface of the semiconductor chip, and including one or more redistribution layers. The conductive pattern layer and the redistribution layer are electrically connected to the connection pad.

19 Claims, 16 Drawing Sheets

(51) Int. Cl.
  *H01L 23/538* (2006.01)
  *H01L 23/00* (2006.01)
  *H01L 23/522* (2006.01)
  *H01L 25/18* (2006.01)

(52) U.S. Cl.
  CPC .......... *H01L 23/5383* (2013.01); *H01L 24/09* (2013.01); *H01L 24/17* (2013.01); *H01L 25/18* (2013.01); *H01L 2224/02379* (2013.01); *H01L 2224/0401* (2013.01)

(58) Field of Classification Search
  USPC .......................................... 438/117; 257/690
  See application file for complete search history.

(56) References Cited

U.S. PATENT DOCUMENTS

| | | | |
|---|---|---|---|
| 9,947,629 | B2 | 4/2018 | Hsu et al. |
| 2006/0244131 | A1 | 11/2006 | Kobayashi et al. |
| 2014/0048906 | A1 | 2/2014 | Shim et al. |
| 2015/0348904 | A1* | 12/2015 | Huang ................ H01L 23/5383 |
| | | | 257/774 |
| 2016/0043047 | A1 | 2/2016 | Shim et al. |
| 2016/0276325 | A1* | 9/2016 | Nair ...................... H01L 21/568 |
| 2017/0345761 | A1* | 11/2017 | Yu ....................... H01L 21/6835 |
| 2018/0082933 | A1 | 3/2018 | Ko et al. |
| 2018/0082962 | A1 | 3/2018 | Lee et al. |
| 2018/0166405 | A1* | 6/2018 | Chiang .................... H01L 24/13 |
| 2018/0190591 | A1* | 7/2018 | Kim ..................... H01L 23/3114 |
| 2018/0204828 | A1* | 7/2018 | Lu .......................... H01L 25/105 |
| 2018/0247905 | A1* | 8/2018 | Yu ....................... H01L 23/5383 |
| 2018/0269139 | A1* | 9/2018 | Chiang ............... H01L 21/6835 |
| 2019/0019756 | A1* | 1/2019 | Yu ....................... H01L 21/4857 |
| 2019/0139846 | A1* | 5/2019 | Lu ....................... H01L 23/3135 |
| 2019/0189572 | A1* | 6/2019 | Chiang ............... H01L 23/5383 |
| 2019/0287953 | A1* | 9/2019 | Moon ................. H01L 21/4857 |

OTHER PUBLICATIONS

Communication dated Dec. 11, 2019, issued by the Taiwanese Intellectual Property Office in counterpart Taiwanese Application No. 108104334.

* cited by examiner

I – I'

FAN-OUT SEMICONDUCTOR PACKAGE

CROSS-REFERENCE TO RELATED APPLICATION

This application claims the benefit of priority to Korean Patent Application No. 10-2018-0091938, filed on Aug. 7, 2018 with the Korean Intellectual Property Office, the entirety of which is incorporated herein by reference.

TECHNICAL FIELD

The present disclosure relates to a semiconductor package, for example, to a fan-out semiconductor package.

BACKGROUND

A significant recent trend in the development of technology related to semiconductor chips has been reductions in the sizes of semiconductor chips. Therefore, in the field of package technology, in accordance with a rapid increase in demand for small-sized semiconductor chips, or the like, the implementation of a semiconductor package, having a compact size, while including a plurality of pins, has been demanded. One type of package technology suggested to satisfy the technical demand, described above, is a fan-out package. Such a fan-out package has a compact size and may allow a plurality of pins to be implemented by redistributing connection terminals outwardly of a region in which a semiconductor chip is disposed.

Meanwhile, in recent years, it has been necessary to form a backside circuit in a semiconductor package structure in order to improve electrical characteristics of a premium smartphone product and to efficiently utilize space. Moreover, requirements for lines and spaces of a backside circuit are increased in accordance with a demand for enhancement of characteristics of a chip and reduction in an area.

SUMMARY

An aspect of the present disclosure provides a fan-out semiconductor package structure capable of easily forming a conductive pattern layer and a conductive via on an encapsulant regardless of material of an encapsulant, and having excellent reliability of a conductive via.

According to an aspect of the present disclosure, an opening of an encapsulant is filled with an insulating layer, and an opening is reformed in the opening of the encapsulant, filled with the insulating layer. In the method described above, a via hole of a conductive via is implemented on an encapsulant.

According to an aspect of the present disclosure, a fan-out semiconductor package includes: a frame, including a wiring layer, and having a through-hole; a semiconductor chip disposed in the through-hole, and having an active surface on which a connection pad is disposed and an inactive surface opposite to the active surface; an encapsulant covering at least a portion of each of the frame and the inactive surface of the semiconductor chip, and having a first opening exposing at least a portion of the wiring layer; an insulating layer disposed on the encapsulant, and having a second opening formed in the first opening to expose at least a portion of the wiring layer; a conductive pattern layer disposed on the insulating layer; a conductive via disposed in the second opening, and electrically connecting the wiring layer to the conductive pattern layer; and a connection structure disposed on the frame and the active surface of the semiconductor chip, and including one or more redistribution layers. The conductive pattern layer and the redistribution layer are electrically connected to the connection pad.

According to an aspect of the present disclosure, a fan-out semiconductor package includes: a first connection structure including one or more redistribution layers; a second connection structure disposed on the first connection structure, and having an electrical connection member electrically connected to the one or more redistribution layers; a semiconductor chip disposed on the first connection structure, and having a connection pad electrically connected to the redistribution layer; an encapsulant disposed on the first connection structure, covering at least a portion of each of the second connection structure and the semiconductor chip, and having a first opening exposing at least a portion of the electrical connection member; and an insulating layer disposed on the encapsulant, and having a second opening formed in the first opening to expose at least a portion of the electrical connection member. The encapsulant and the insulating layer include different materials.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
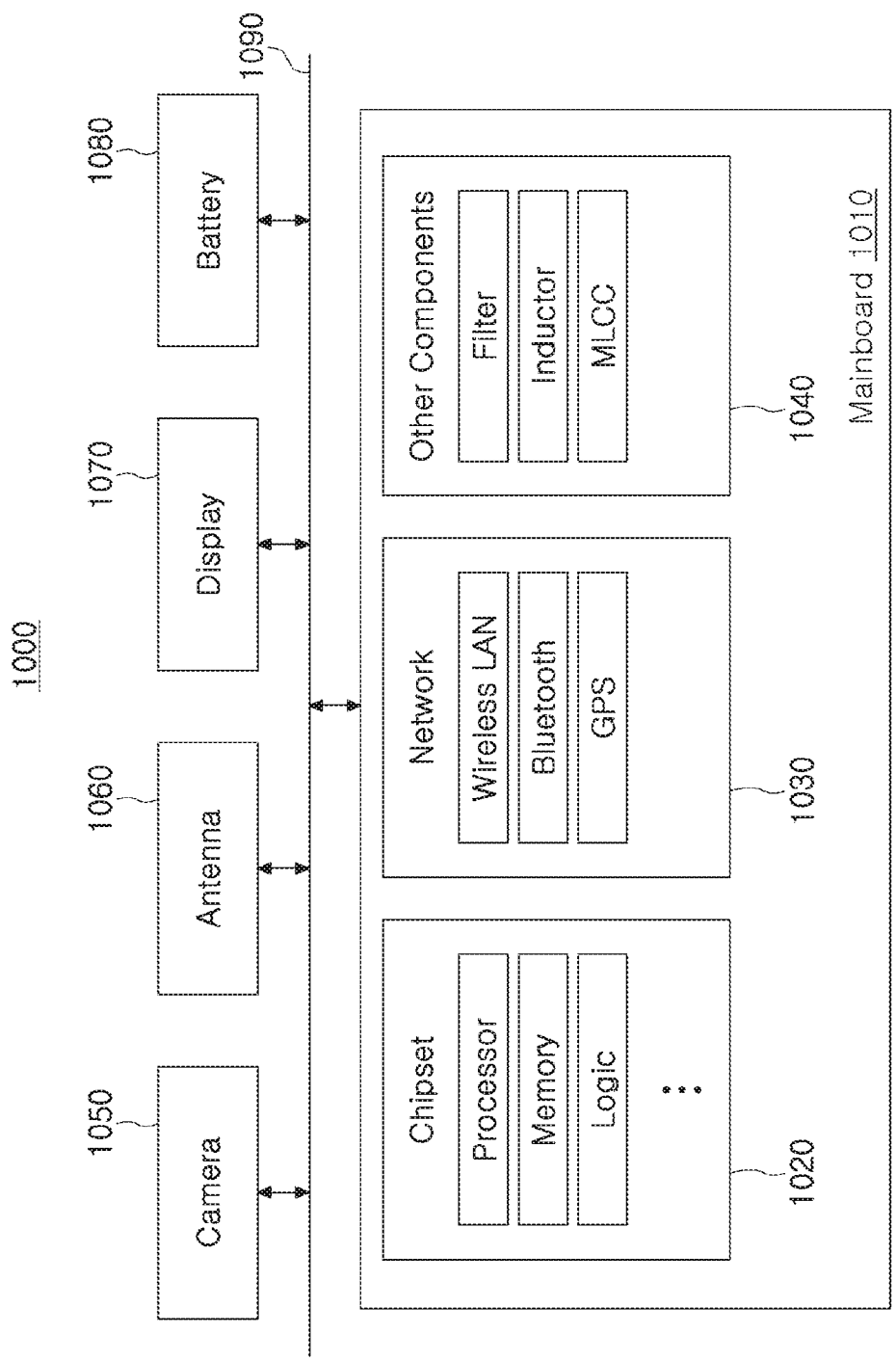
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
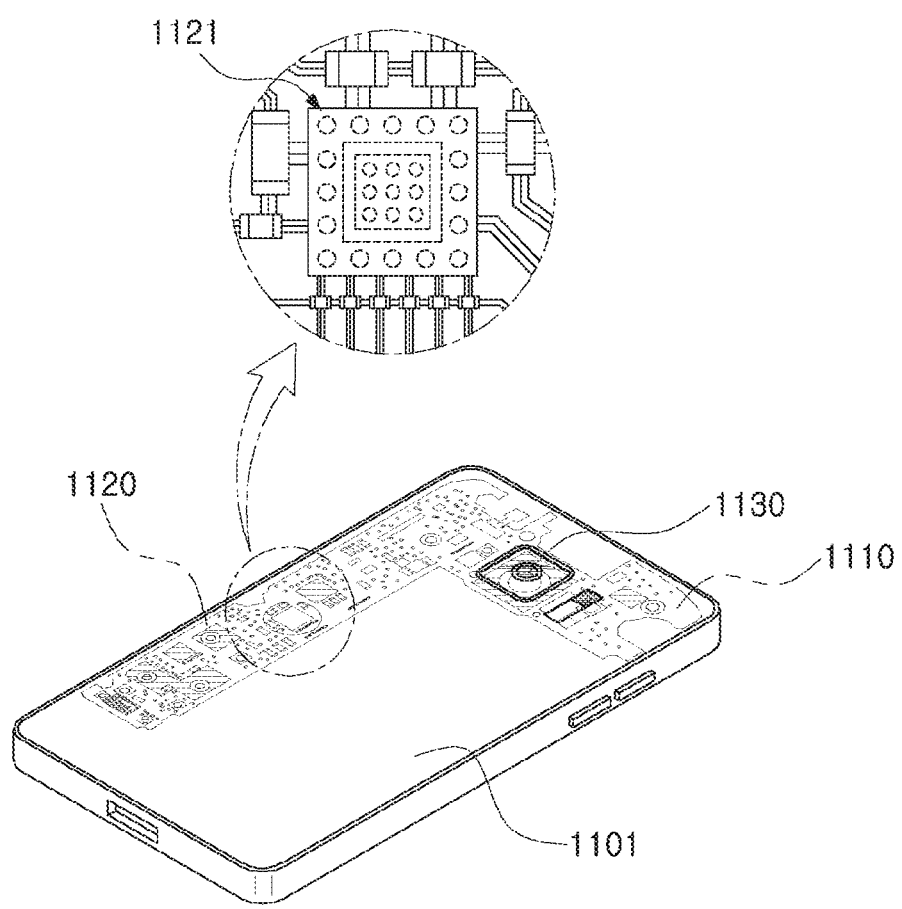
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
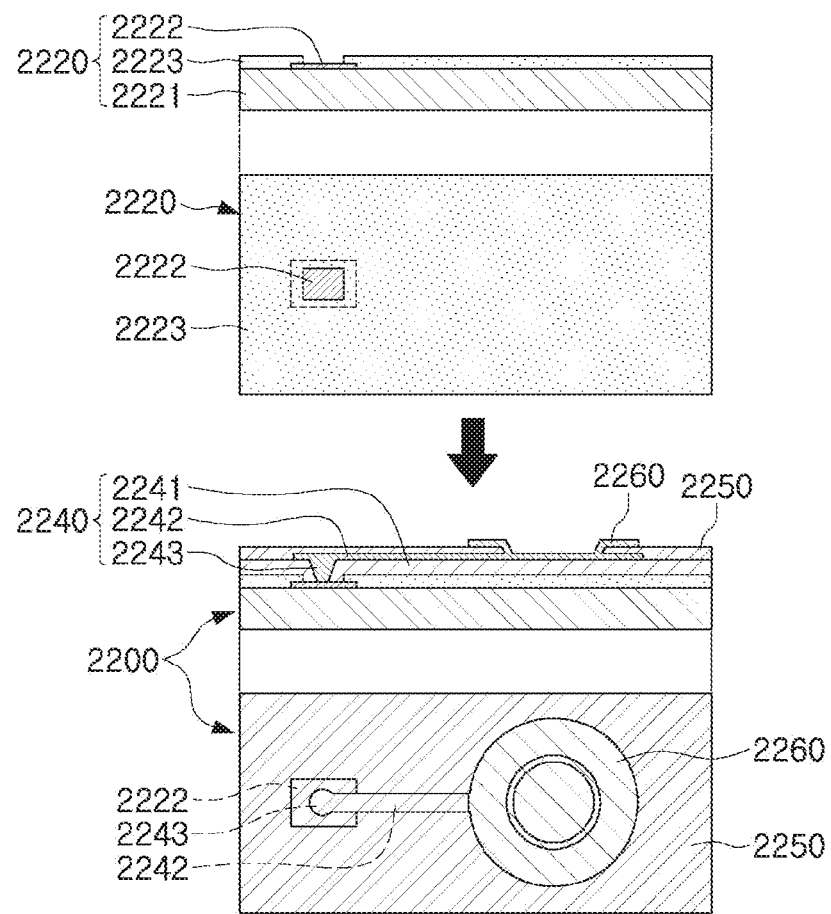
FIGS. 3A and 3B are schematic cross-sectional views illustrating states of a fan-in semiconductor package before and after being packaged.
Figure 3B:
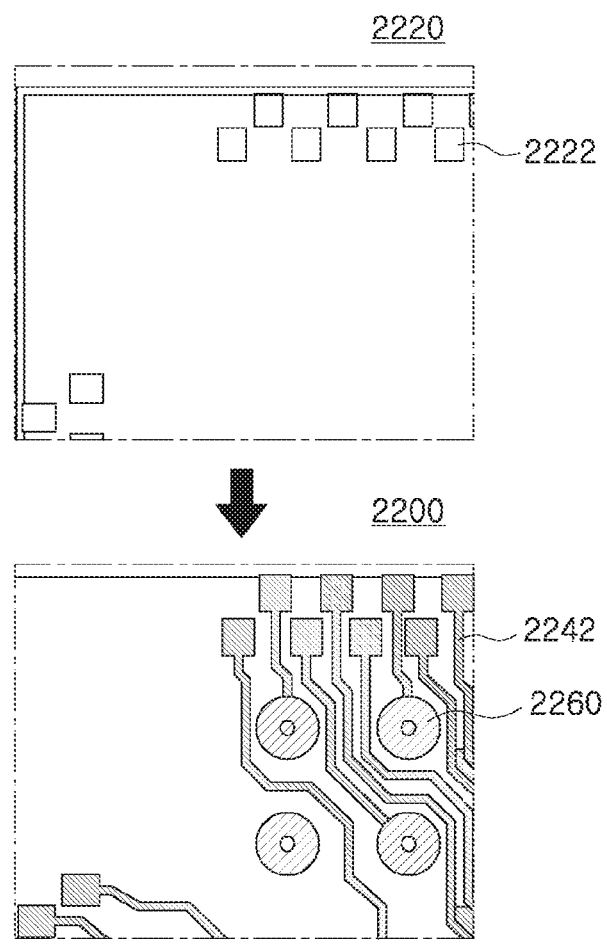

FIGS. 3A and 3B are schematic cross-sectional views illustrating states of a fan-in semiconductor package before and after being packaged.

Figure 4:
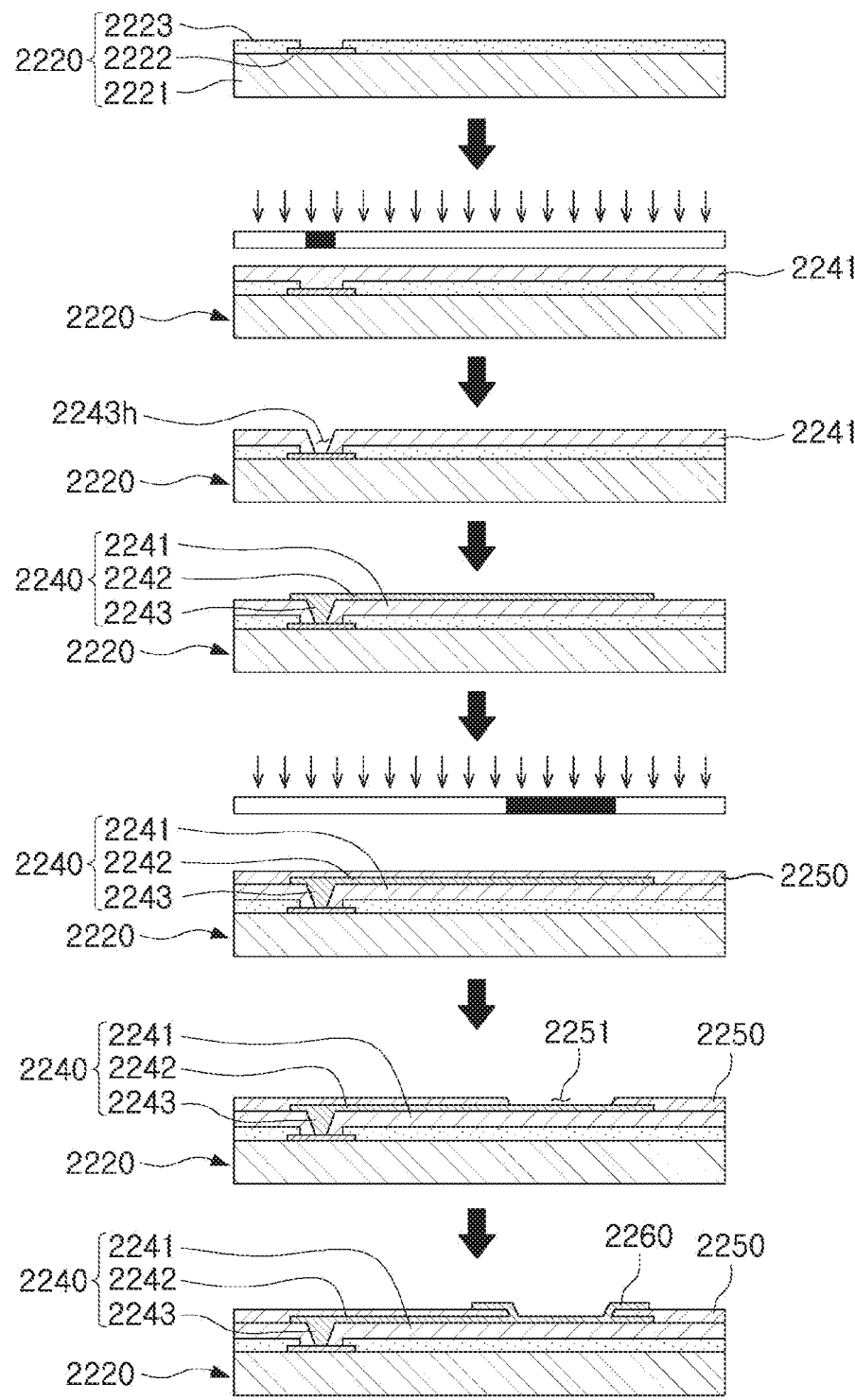
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal 2260, or the like, may be formed. That is, a fan-in semiconductor package 2200 including, for example, the semiconductor chip 2220, the connection structure 2240, the passivation layer 2250, and the underbump metal 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
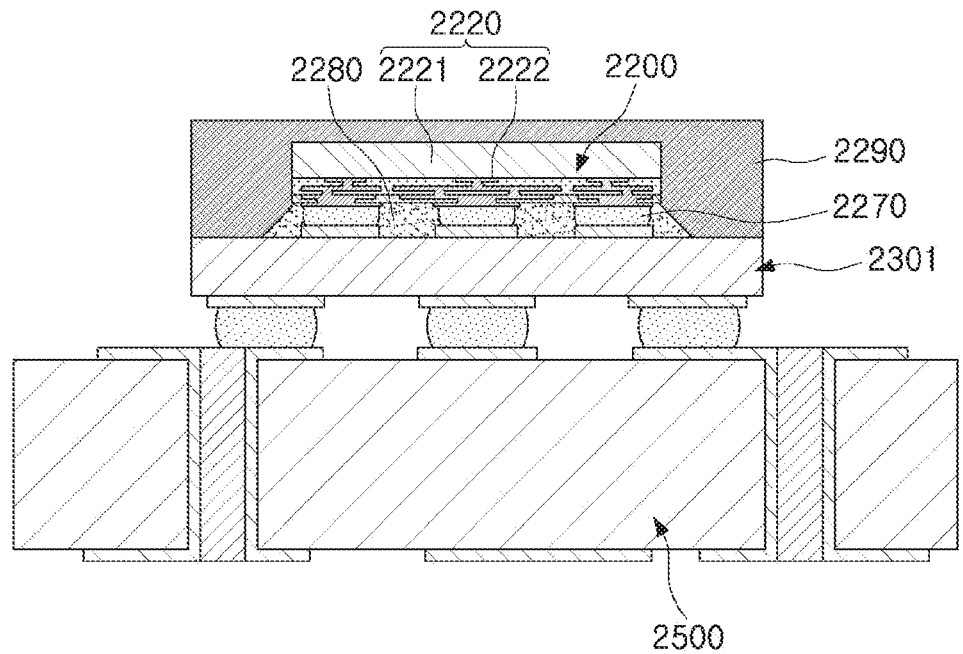
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
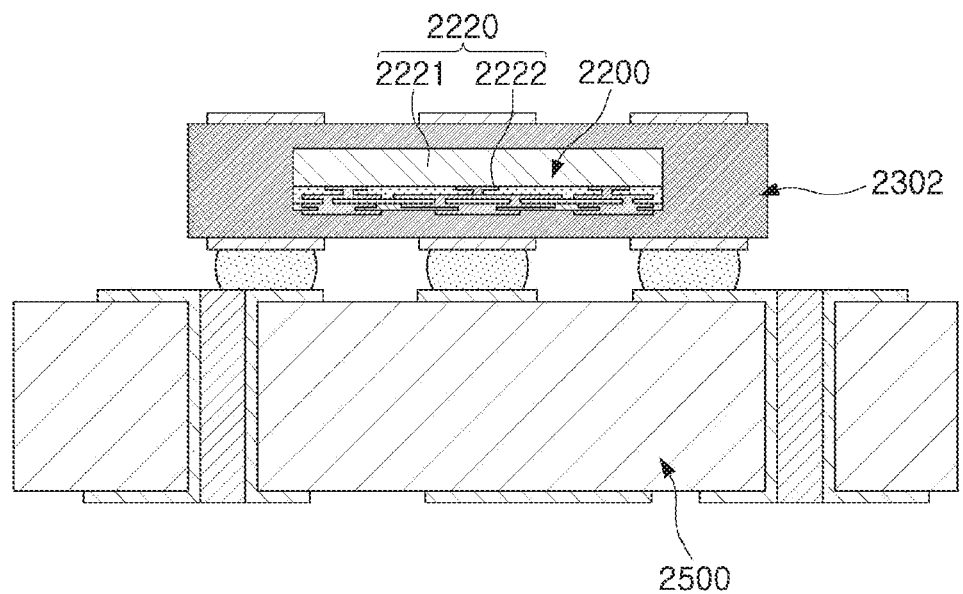
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
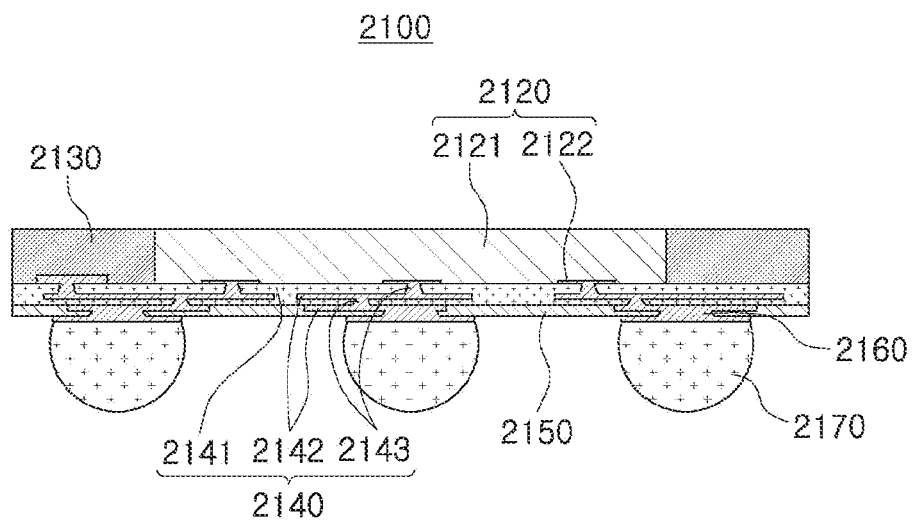
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal 2160 may further be formed in openings of the passivation layer 2150. Solder balls 2170 may further be formed on the underbump metal 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
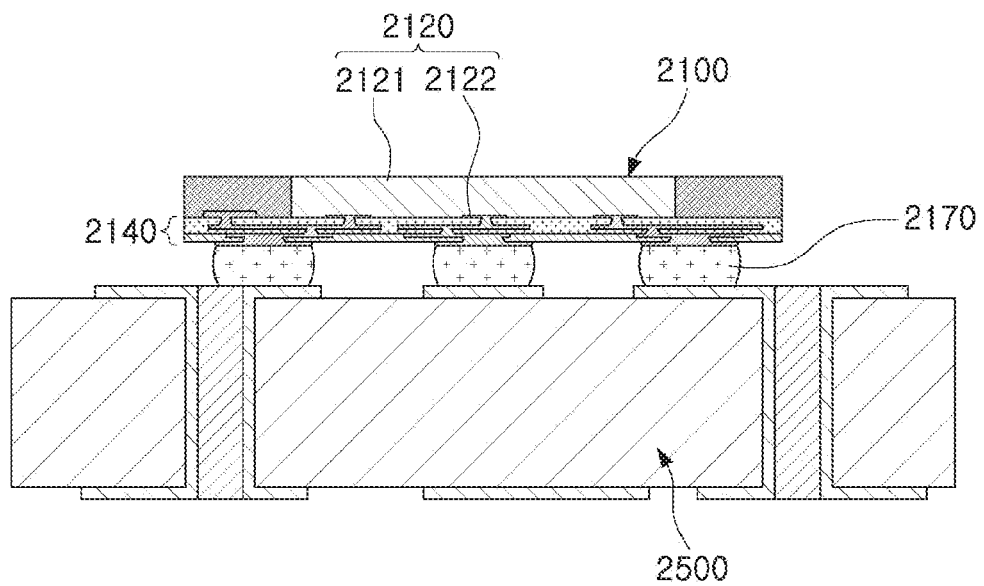
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a fan-out semiconductor package, in which selection of a material of the encapsulant is wide and reliability of a conductive via may be improved, will be described with reference to the drawings.

Figure 9:
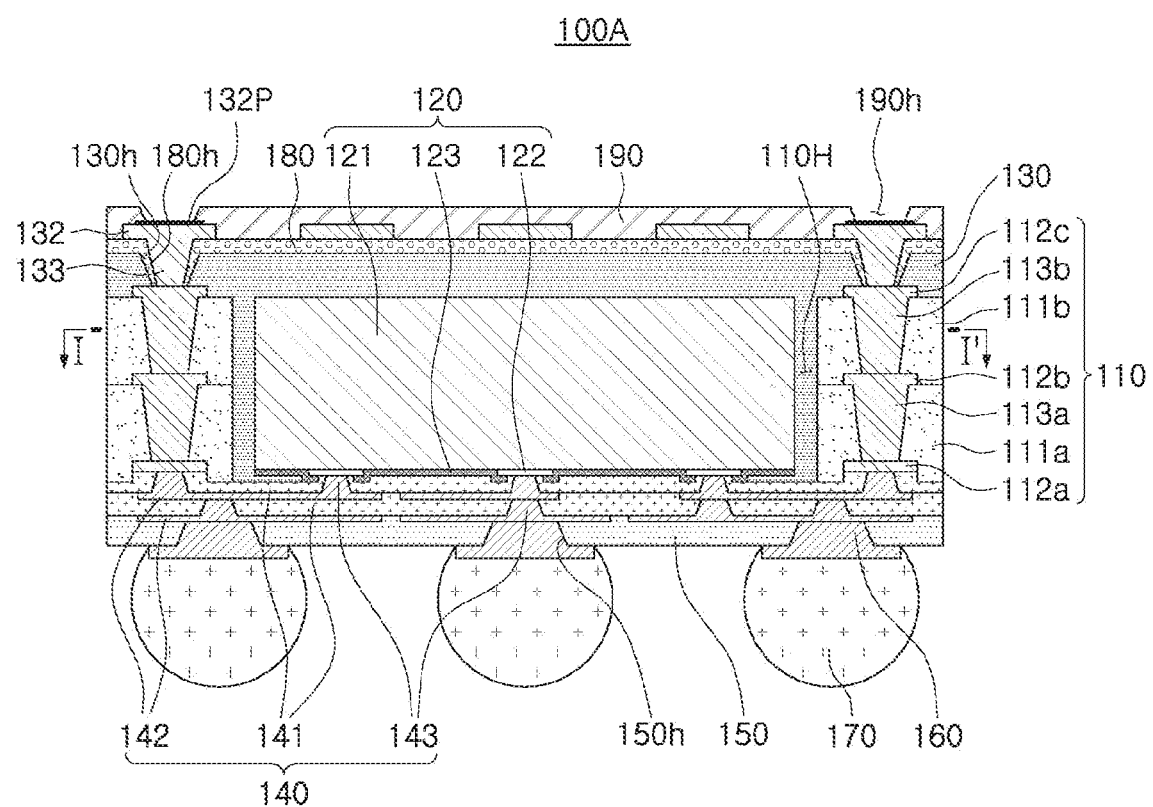
FIG. 9 is a schematic cross-sectional view illustrating an example of a fan-out semiconductor package.

FIG. 9 is a schematic cross-sectional view illustrating an example of a semiconductor package.

Figure 10:
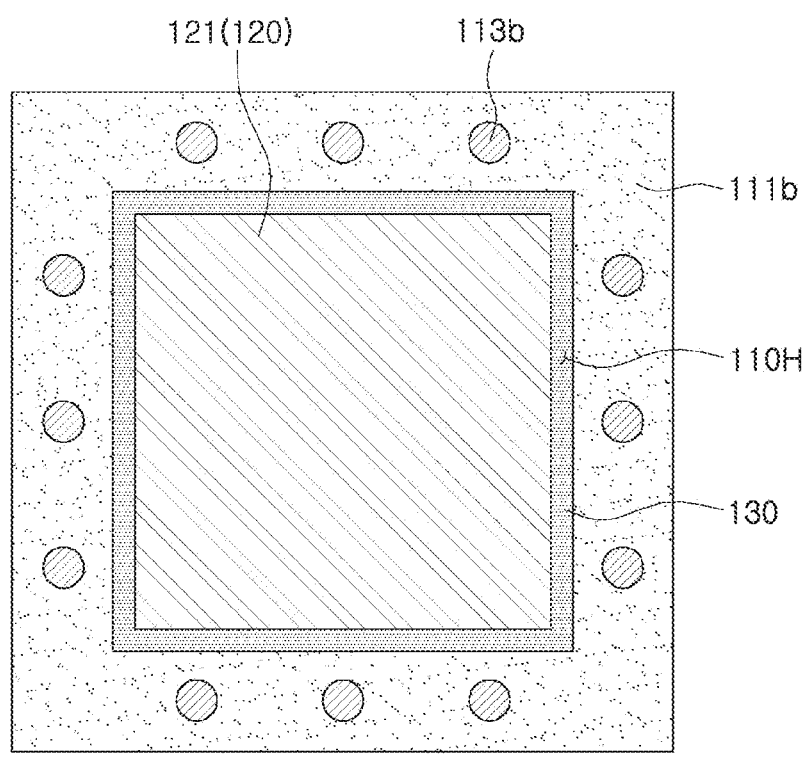
FIG. 10 is a schematic plan view taken along line I-I' of the semiconductor package of FIG. 9.

FIG. 10 is a schematic plan view taken along line I-I' of the semiconductor package of FIG. 9.

Referring to FIG. 9, a fan-out semiconductor package 100A according to an example may include a frame 110 including one or more wiring layers 122a, 112b, and 112c and having a through-hole 110H, a semiconductor chip 120 disposed in the through-hole 110H and having an active surface on which the connection pad 122 is disposed and an inactive surface opposite to the active surface, an encapsulant 130 covering at least a portion of each of the frame 110 and the inactive surface of the semiconductor chip 120 and having a first opening 130h exposing at least a portion of an uppermost wiring layer 112c, an insulating layer 180 disposed on the encapsulant 130 and having a second opening 180h disposed in the first opening 130h and exposing at least a portion of the uppermost wiring layer 112c, a conductive pattern layer 132 disposed on the insulating layer 180, a conductive via 133 disposed in the second opening 180h and electrically connecting the uppermost wiring layer 112c to the conductive pattern layer 132, and a connection structure 140 disposed on the frame 110 and the active surface of the semiconductor chip 120 and including one or more redistribution layers 142. The conductive pattern layer 132, the wiring layers 112a, 112b, and 112c, as well as the redistribution layer 142 are electrically connected to the connection pad 122. If necessary, a passivation layer 150 having a third opening 150h exposing at least a portion of a lowermost redistribution layer 142 may be disposed on the connection structure 140, an underbump metal 160 may be disposed in the third opening 150h, and the underbump metal 160 and an electrical connection structure 170 may be connected to each other.

Recently, it is required to form a backside circuit in a semiconductor package structure to improve electrical characteristics of a premium smartphone product and to efficiently use a space. Moreover, requirements for lines and spaces of the backside circuit are increased in accordance with the demand for the enhancement of characteristics of a chip and reduction in an area. Thus, a technique for forming a backside circuit by plating on a molding material sealing a semiconductor chip has been proposed. However, in a process in which a backside circuit is formed after a semiconductor chip is sealed, a molding material, having been heated, is continuously hardened, and thus original physical properties may be lost. Thus, when a backside circuit is formed, it is difficult to secure adhesion between a backside circuit and a molding material. Moreover, when a microcircuit is implemented, it is difficult to form surface roughness. To solve the problems described above, it may be considered that an insulating layer is additionally stacked on a molding material, and a backside circuit is formed on the insulating layer, additionally stacked. In this case, a thickness may be thickened. Moreover, if different materials having a thin thickness to reduce a thickness, due to a difference in physical properties between materials, there may be a limitation in clearing or a method for forming a via hole for a backside circuit.

On the other hand, in the fan-out semiconductor package 100A according to an example, an insulating layer 180 is additionally stacked on an encapsulant 130, a conductive pattern layer 132 and a conductive via 133 are formed on the insulating layer 180, and a plurality of openings 130h and 180h are used for a via hole for formation of the conductive via 133. For example, a first opening 130h and a second opening 180h are formed in the encapsulant 130 and the insulating layer 180 to form a double via hole. In other words, a via hole in which the conductive via 133 is formed is the second opening 180h, and the second opening 180h does not pass through the encapsulant 130, but passes through the insulating layer 180, filling the first opening 130h. Thus, as described above, even when an insulating layer 180 having a thin thickness, formed of a material different from that of the encapsulant 130, a limitation in formation of a via hole due to a difference in physical properties between different materials may not occur. For example, even when the encapsulant 130 is a non-photosensitive insulating layer and the insulating layer 180 is a photosensitive insulating layer, the first opening 130h is formed using a laser in the encapsulant 130, and the second opening 180h is formed using a photolithography process in the insulating layer 180 thereafter. In other words, the first opening 130h and the second opening 180h are independently formed, so the limitation due to a difference in physical properties between different materials is not significant. Thus, a freedom degree of material selection of the encapsulant 130 and/or the insulating layer 180 is high. Moreover, since the insulating layer 180, an insulating material, is disposed between the first opening 130h and the second opening 180h, effects of moisture absorption or chemicals are reduced, so reliability may be secured.

The respective components included in the fan-out semiconductor package 100A according to the exemplary embodiment will hereinafter be described in more detail.

The frame 110 may improve rigidity of the fan-out semiconductor package 100A depending on certain materials of the insulating layers 111a and 111b, and serve to secure uniformity of a thickness of the encapsulant 130. The frame 110 may have a through-hole 110H, passing through the insulating layers 111a and 111b. In the through-hole 110H, the semiconductor chip 120 is disposed, and a passive component (not shown) may be disposed together as required. The through-hole 110H may have a form with a wall surface surrounding the semiconductor chip 120, but is not limited thereto. The frame 110 may include wiring layers 112a, 112b, and 112c as well as wiring vias 113a and 113b, in addition to the insulating layers 111a and 111b, and may thus function as a connection structure. In this case, the wiring layers 112a, 112b, and 112c, as well as the wiring vias 113a and 113b may function as an electrical connection member. If necessary, a connection structure having an electrical connection member capable of providing an upper/lower electrical connection path in a different form may be disposed rather than the frame 110.

The frame 110 may include a first insulating layer 111a in contact with the connection structure 140, a first wiring layer 112a in contact with the connection structure 140 and embedded in the first insulating layer 111a, a second wiring layer 112b disposed on a side of the first insulating layer 111a opposite to a side of the first insulating layer 111a in which the first wiring layer 112a is embedded, a second insulating layer 111b disposed on a side of the first insulating layer 111a opposite to a side of the first insulating layer 111a in which the first wiring layer 112a is embedded and covering at least a portion of the second wiring layer 112b, and a third wiring layer 112c disposed on a side of the second insulating layer 111b opposite to a side of the second insulating layer 111b in which the second wiring layer 112b is embedded. The first wiring layer 112a and the second wiring layer 112b, as well as the second wiring layer 112b and the third wiring layer 112c may be electrically connected to each other through the first wiring via 113a and the second wiring via 113b, passing through the first insulating layer 111a and the second insulating layer 111b, respectively. The first to third wiring layers 112a, 112b, and 112c may be electrically connected to the connection pad 122 through the redistribution layer 142 of the connection structure 140.

A material of each of the first and second insulating layers 111a and 111b is not particularly limited. For example, an insulating material may be used as the material of each of the first and second insulating layers 111a and 111b. In this case, the insulating material may be a thermosetting resin such as an epoxy resin, a thermoplastic resin such as a polyimid resin, or a resin in which the thermosetting resin or the thermoplastic resin is mixed with an inorganic filler, for example, an Ajinomoto build-up film (ABF), or the like. Alternatively, the insulating material may be a material in which the thermosetting resin or the thermoplastic resin is impregnated together with an inorganic filler in a core material such as a glass fiber (or a glass cloth or a glass fabric), for example, a prepreg. Alternatively, a PID resin may also be used as the insulating material.

The wiring layers 112a, 112b, and 112c may provide an upper/lower electrical connection path of a package with the wiring vias 113a and 113b, and may serve to redistribute the connection pad 122. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers may include via pads, wire pads, electrical connection structure pads, and the like. The wiring layers 112a, 112b, and 112c may be formed using a known plating process, and each may be formed of a seed layer and a conductor layer. A thickness of each of the wiring layers 112a, 112b, and 112c may be greater than that of each of the redistribution layers 142.

The first wiring layer 112a may be recessed inwardly of the first insulating layer 111a. As described above, when the first wiring layer 112a is recessed inwardly of the first insulating layer 111a and a step is provided between a lower surface of the first insulating layer 111a and a lower surface of the first wiring layer 112a, the first wiring layer 112a may be prevented from being contaminated by bleeding of a formation material of the first encapsulant 131.

The wiring vias 113a and 113b may electrically connect the wiring layers 112a, 112b, and 112c formed on different layers to each other, resulting in an electrical path in the frame 110. A material of each of the wiring vias 113a and 113b may be a conductive material such as copper (Cu), aluminum (Al), silver (Ag), tin (Sn), gold (Au), nickel (Ni), lead (Pb), titanium (Ti), or alloys thereof. Each of the wiring vias 113a and 113b may be a via in a filled type, filled with a conductive material, or may be a via in a conformal type, in which a conductive material is formed along a wall surface of a via hole. Moreover, a tapered shape may be applied thereto. The wiring vias 113a and 113b may also be formed using a plating process, and each may be formed of a seed layer and a conductor layer.

When a hole for the first wiring via 113a is formed, some pads of the first wiring layer 112a may serve as a stopper. In this regard, it may be advantageous in a process in that the first wiring via 113a has a tapered shape in which a width of an upper surface is greater than a width of a lower surface. In this case, the first wiring via 113a may be integrated with a pad pattern of the second wiring layer 112b. When a hole for the second wiring via 113b is formed, some pads of the second wiring layer 112b may serve as a stopper. In this regard, it may be advantageous in a process in that the second wiring via 113b has a tapered shape in which a width of an upper surface is greater than a width of a lower surface. In this case, the second wiring via 113b may be integrated with a pad pattern of the third wiring layer 112c.

Meanwhile, although not illustrated in the drawings, if necessary, for the purpose of electromagnetic shielding or for heat dissipation, a metal layer (not shown) may be disposed on a wall surface of the through-hole 110H of the frame 110, and the metal layer (not shown) may surround the semiconductor chip 120.

The semiconductor chip 120 may be an integrated circuit (IC) provided in an amount of several hundred to several million or more elements integrated in a single chip. In this case, the IC may be, for example, an application processor chip such as a central processor (for example, a CPU), a graphics processor (for example, a GPU), a digital signal processor, a cryptographic processor, a microprocessor, a microcontroller, or the like, but is not limited thereto. Here, the IC may be a Power Management IC (PMIC), a memory chip such as a volatile memory (e.g., DRAM), a non-volatile memory (e.g., ROM), a flash memory, or an analog-to-digital converter, or a logic chip such as an application-specific IC (ASIC).

The semiconductor chip 120 may be an integrated circuit in a bare state in which a separate bump or a wiring layer is not provided. However, it is not limited thereto, and the semiconductor chip 120 may be a package-type integrated circuit, if necessary. The integrated circuit may be provided based on an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer. An insulating layer (not illustrated), and the like, may also be further disposed in other required positions. Meanwhile, in the semiconductor chip 120, a side, on which connection pad 122 is disposed, is an active surface, and the opposite side is an inactive surface. In this case, when the passivation film 123 is formed on the active surface of the semiconductor chip 120, the positional relationship of the active surface of the semiconductor chip 120 is determined based on a lowermost surface of the passivation film 123.

The encapsulant 130 may encapsulate the frame 110 and the semiconductor chip 120. Moreover, the encapsulant may fill at least a portion of the through-hole 110H. The encapsulant 130 may include an insulating material. The insulating material may be a material containing an inorganic filler and an insulating resin, for example, a thermosetting resin such as an epoxy resin, a thermoplastic resin such as a polyimid, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, a molding material such as EMC may be used, or a photosensitive material, that is, a photo imageable encapsulant (PIE) may be used, as needed. As needed, a material in which an insulating resin such as the thermosetting resin or the thermoplastic resin is impregnated in a core material such as an inorganic filler and/or a glass fiber (or a glass cloth or a glass fabric), may be used.

The insulating layer 180 is disposed on the encapsulant 130, and may cover the encapsulant 130. The insulating layer 180 may include a material different from that of the encapsulant 130. For example, the insulating layer 180 may include a material having physical properties such as an elastic modulus or a thermal expansion coefficient, different from that of the encapsulant 130. The insulating layer 180 may include an insulating material. In this case, the insulating material may be a photosensitive insulating material, that is, a PID. In this case, the insulating layer 180 having a thin thickness may be formed. Moreover, when the second opening 180h is formed, a fine pitch may be provided. In addition, a microcircuit is also easily formed, and an overall thickness of a package is further reduced. However, a material is not limited to a PID, and there is no limitation in material selection.

The first opening 130h passes through at least a portion of the encapsulant 130, and exposes at least a portion of a third wiring layer 112c located in an uppermost portion of the frame 110. At least a portion of the first opening 130h is filled with an insulating layer 180. A second opening 180h is formed in the first opening 130h, filled with the insulating layer 180. In other words, the second opening 180h passes through the insulating layer 180, filling the first opening 130h, and exposes at least a portion of a third wiring layer 112c located in an uppermost portion of the frame 110. An insulating layer 180 is disposed between the first opening 130h and the second opening 180h. In other words, the first opening 130h and the second opening 180h are independently formed in the encapsulant 130 and the insulating layer 180, respectively, so different materials may be selected to form the first opening and the second opening.

The conductive pattern layer 132 may be disposed on the insulating layer 180. The conductive pattern layer 132 may also include a conductive material such as copper (Cu), aluminum (Al), silver (Ag), tin (Sn), gold (Au), nickel (Ni), lead (Pb), titanium (Ti), or alloys thereof. The conductive pattern layer 132 may perform various functions depending on designs. For example, the conductive pattern layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the conductive pattern layer may include via pads, wire pads, electrical connection structure pads, and the like. The conductive pattern layer 132 may be formed using a known plating process, and each may be formed of a seed layer and a conductor layer.

The conductive via 133 is formed in the second opening 180h to electrically connect the conductive pattern layer 132 to the third wiring layer 112c. The conductive via 133 may also include a conductive material such as copper (Cu), aluminum (Al), silver (Ag), tin (Sn), gold (Au), nickel (Ni), lead (Pb), titanium (Ti), or alloys thereof. The conductive via 133 may be a via in a filled type, filled with a conductive material, or may be a via in a conformal type, in which a conductive material is formed along a wall surface of a via hole. Moreover, a tapered shape may be applied thereto. The conductive via 133 may be formed using a plating process, and each may be formed of a seed layer and a conductor layer.

The connection structure 140 may redistribute the connection pads 122 of the semiconductor chip 120. Each of several tens to several hundreds of connection pads 122 of the semiconductor chip 120 having various functions may be redistributed by the connection structure 140, and may be physically or electrically externally connected through the electrical connection structures 170 depending on functions. The connection structure 140 may include an insulating layer 141, provided as one or more layers, a redistribution layer 142, provided as one or more layers, and a connection via 143, provided as one or more layers, and those may be provided in an amount greater or less than those illustrated in the drawings.

A material of the insulating layer 141 may be an insulating material. In this case, the insulating material may be a photoimageable dielectric (PID) material. Here, a fine pitch may be introduced through a photo via, so several tens to several millions of connection pads 122 of the semiconductor chip 120 may be significantly effectively redistributed.

The redistribution layers 142 may redistribute the connection pad 122 of the semiconductor chip 120 to be electrically connected to the electrical connection structure 170. A material of each of the redistribution layers 142 may also be a conductive material such as copper (Cu), aluminum (Al), silver (Ag), tin (Sn), gold (Au), nickel (Ni), lead (Pb), titanium (Ti), or alloys thereof. The redistribution layer 142 may also perform various functions depending on a design thereof. For example, the redistribution layer may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer may include via pads, electrical connection structure pads, and the like.

The connection via 143 electrically connects the redistribution layers 142, formed in different layers, to each other, and electrically connects the connection pad 122 of the semiconductor chip 120 to the redistribution layer 142. The connection via 143 may be in physical contact with the connection pad 122 when the semiconductor chip 120 is a bare die. A material of the connection via 143 may also be a conductive material such as copper (Cu), aluminum (Al), silver (Ag), tin (Sn), gold (Au), nickel (Ni), lead (Pb), titanium (Ti), or alloys thereof. Each of the connection vias 143 may also be completely filled with the conductive material, or the conductive material may be formed along a wall of each of via holes. Moreover, a tapered shape may also be applied to a shape of the connection via 143.

The passivation layer 150, as an additional component, may protect the connection structure 140 from external physical or chemical damage. The passivation layer 150 may include an insulating resin and an inorganic filler, but may not include a glass fiber. For example, the passivation layer 150 may be ABF, but is not limited thereto. The passivation layer 150 may have a third opening 150h exposing at least a portion of the redistribution layer 142 in a lowermost portion.

The underbump metal 160, as an additional component, may improve connection reliability of the electrical connection structure 170 to improve board level reliability of the fan-out semiconductor package 100A. The number of the underbump metal 160 may be several tens to several millions. Each of the underbump metals 160 may be connected to the redistribution layer 142 through the third opening 150h passing through the passivation layer 150. The underbump metal 160 may be formed by any known metallization method using a metal, but is not limited thereto.

The electrical connection structure 170 physically and/or electrically connects the semiconductor package 100A to an external power source. For example, the semiconductor package 100A may be mounted on the mainboard of the electronic device through the electrical connection structure 170. The electrical connection structure 170 may be formed of a low melting point metal, for example, tin (Sn) or an alloy including tin (Sn). In more detail, the electrical connection structure 170 may be formed of a solder, or the like. However, this is only an example, and a material of the electrical connection structure 170 is not particularly limited thereto. Each of the electrical connection structures 170 may be a land, a ball, a pin, or the like. The electrical connection structures 170 may be formed as a multilayer or single layer structure. When the electrical connection structure 170 includes the plurality of layers, the electrical connection metal includes a copper pillar and a solder. When the electrical connection structure 170 includes the single layer, the electrical connection metal includes a tin-silver solder or copper. However, the electrical connection structure 170 is only an example, and the present disclosure is not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

If necessary, a cover layer 190 having a fourth opening 190h exposing at least a portion of the conductive pattern layer 132 may be disposed on the insulating layer 180. The cover layer 190 may include ABF, or the like, but is not limited thereto. A surface treatment layer 132P may be disposed on a surface of the conductive pattern layer 132, having been exposed by the fourth opening 190h in the cover layer 190. The surface treatment layer 132P are not particularly limited as long as they are known in the related art, and may be formed by, for example, electrolytic gold plating, electroless gold plating, OSP or electroless tin plating, electroless silver plating, electroless nickel plating/substituted gold plating, DIG plating, HASL, or the like.

Figure 11A:
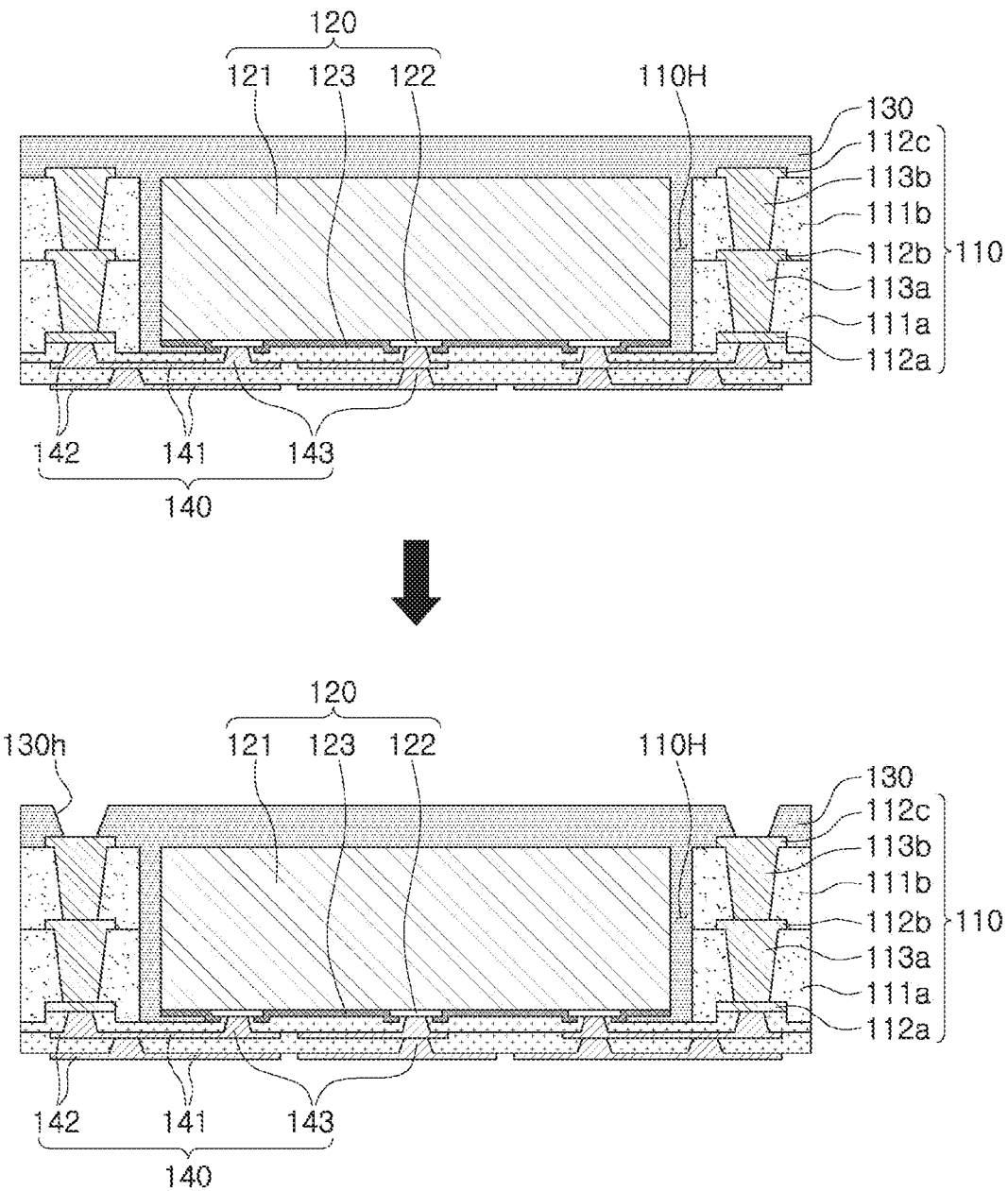
FIGS. 11A and 11B are schematic process drawings illustrating a process for forming a first opening and a second opening for a conductive via of the fan-out semiconductor package of FIG. 9.
Figure 11B:
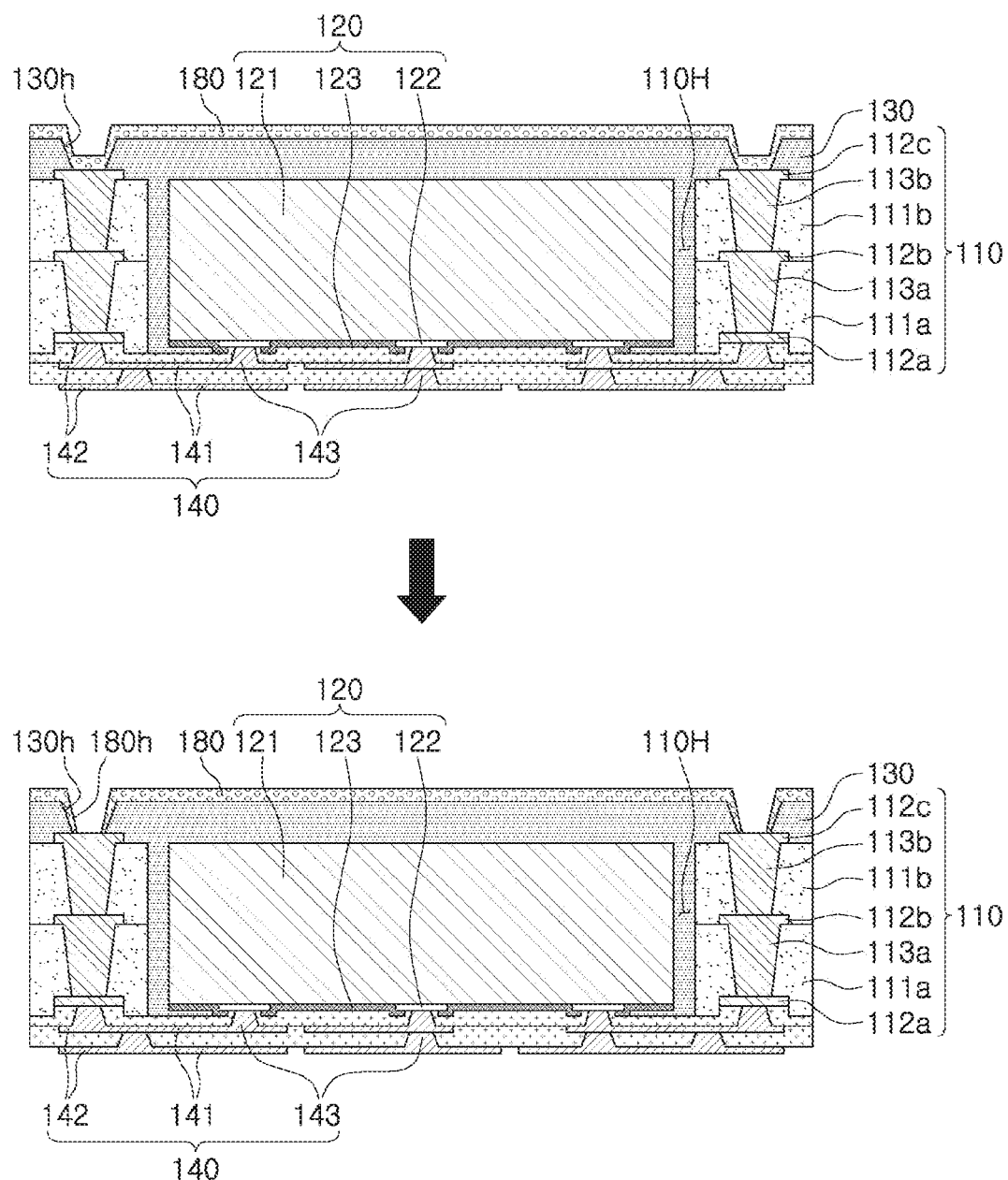

FIGS. 11A and 11B are schematic process drawings illustrating a process for forming a first opening and a second opening for a conductive via of the fan-out semiconductor package of FIG. 9.

Referring to FIG. 11A, first, a first opening 130h, exposing at least a portion of the third wiring layer 112c of the frame 110 is formed in the encapsulant 130. A method for processing the first opening 130h may be selected according to a material of the encapsulant 130. For example, when the encapsulant 130 is a non-photosensitive insulating layer such as ABF, the first opening may be formed using laser processing in which the third wiring layer 112c is used as a stopper layer. After the first opening 130h is formed, clearing may be performed in accordance with a material of the encapsulant 130. For example, when the encapsulant 130 is a non-photosensitive insulating layer such as ABF, clearing may be performed by a desmear treatment.

Referring to FIG. 11B, then, the insulating layer 180 is formed on the encapsulant 130. The insulating layer 180 may be formed to have a thin thickness. The insulating layer 180 may be formed by applying and hardening a photosensitive insulating material, or may be formed using a method in which a photosensitive insulating film is laminated. Then, a second opening 180h, exposing at least a portion of the third wiring layer 112c of the frame 110, is formed in a region filling the first opening 130h, of the insulating layer 180. A method for processing the second opening 180h may be selected according to a material of the insulating layer 180. For example, when the insulating layer 180 is a photosensitive insulating layer such as a PID, the second opening may be formed using a photolithography method, and clearing may also be performed. Then, using a plating process, on the insulating layer 180 and in the second opening 180h, a conductive pattern layer (not shown) and a conductive via (not shown) may be formed.

Figure 12:
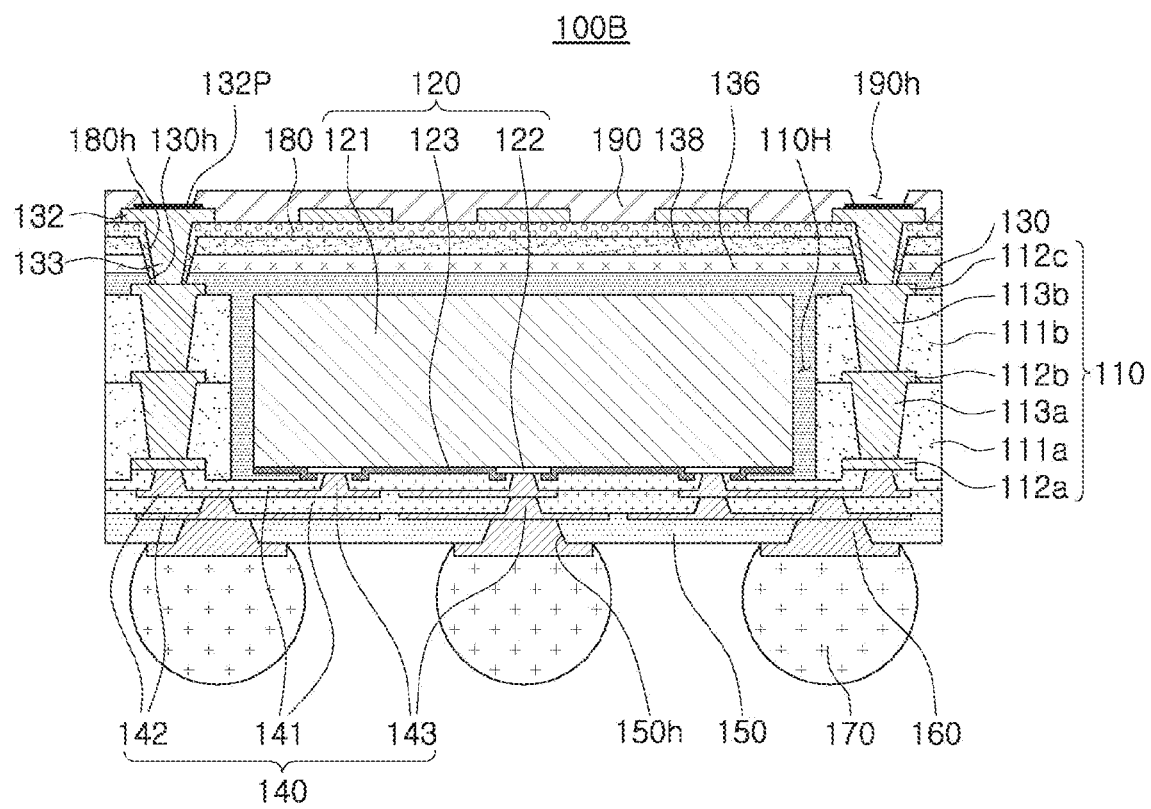
FIG. 12 illustrates another example of a fan-out semiconductor package.

FIG. 12 illustrates another example of a fan-out semiconductor package.

Referring to FIG. 12, a fan-out semiconductor package 100B according to another example may further include a reinforcing layer 136 disposed between the encapsulant 130 and the insulating layer 180, and a resin layer 138 disposed between the reinforcing layer 136 and the insulating layer 180, in comparison with the fan-out semiconductor package 100A according to an example, described above. In other words, the fan-out semiconductor package 100B according to another example may have a form in which the encapsulant 130, the reinforcing layer 136, the resin layer 138, and the insulating layer 180 are sequentially stacked. The reinforcing layer 136 may serve to control by introducing rigidity of a package. Similarly, the reinforcing layer 136 may have an elastic modulus, greater than that of each of the encapsulant 130, the insulating layer 180, and the resin layer 138. The first opening 130h may also pass through not only the encapsulant 130 but also the reinforcing layer 136 and the resin layer 138. In other words, the resin layer 138 may be introduced to form the first opening 130h in the reinforcing layer 136. For example, when the reinforcing layer 136 is only provided, it is difficult to perform laser processing. However, since the resin layer 138 is further provided, laser processing is easily performed. Thus, the first opening 130h, passing through the reinforcing layer 136 and the resin layer 138, is easily provided.

A material of the reinforcing layer 136 may be a material capable of maintaining rigidity. For example, the material may be a thermosetting resin such as an epoxy resin, a thermoplastic resin such as a polyimide resin, a resin in which the thermosetting resin or the thermoplastic resin is impregnated together with an inorganic filler in a core material such as a glass fiber, in detail, a prepreg. On the other hand, the resin layer 138 may be a material not including a thermosetting resin such as an epoxy resin, a thermoplastic resin such as a polyimide resin, and an inorganic filler, but including a glass fiber, for example, ABF. In a process in which the first opening 130h, passing through the reinforcing layer 136 and the resin layer 138, is formed using the material described above, a process for cleaning a via hole may be performed using desmear, and clearing may be performed using an etching process, if necessary, in a portion of the reinforcing layer 136, including a glass fiber.

On the other hand, in the fan-out semiconductor package 100B according to another example, the encapsulant 130 and the insulating layer 180 are a non-photosensitive insulating layer. In other words, the insulating layer 180 may be ABF, including an insulating resin and an inorganic filler, by way of example. However, specific compositions of materials of the insulating layer 180 and the encapsulant 130 may be different from each other. In other words, physical properties such as an elastic modulus or a thermal expansion coefficient, of the insulating layer 180 and the encapsulant 130, may be different from each other. When the insulating layer 180 is a non-photosensitive insulating layer, a process for cleaning a via hole may be performed using desmear in a process for forming the second opening 180h. In this case, surface roughness may be easily formed. Thus, when a plating layer such as a conductive pattern layer 132 and a conductive via 133 is formed, a risk of chemical copper non-plating may be reduced. Other contents overlap those described above with reference to FIGS. 9 to 11B, and a detailed description thereof is thus omitted.

Figure 13:
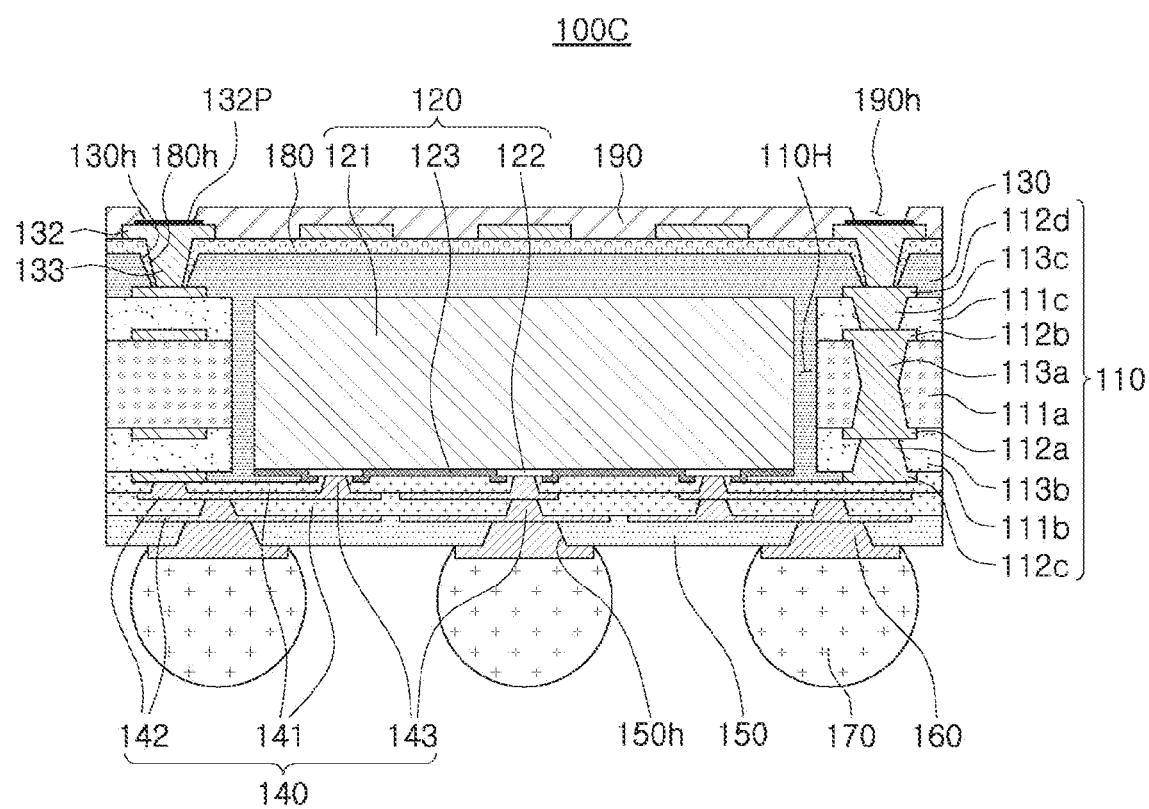
FIG. 13 illustrates another example of a fan-out semiconductor package.

FIG. 13 illustrates another example of a fan-out semiconductor package.

Referring to FIG. 13, a fan-out semiconductor package 100C according to another example may have a frame 110 having a shape different from that of the fan-out semiconductor package 100A according to an example, described above. In detail, in the fan-out semiconductor package 100C according to another example, a frame 110 may include a first insulating layer 111a, a first wiring layer 112a disposed on one side of the first insulating layer 111a, a second wiring layer 112b disposed on the other side of the first insulating layer 111a, a second insulating layer 111b disposed on one side of the first insulating layer 111a and covering at least a portion of the first wiring layer 112a, a third wiring layer 112c disposed on a side of the second insulating layer 111b opposite to a side of the second insulating layer 111b in which the first wiring layer 112a is embedded, a third insulating layer 111c disposed on the other side of the first insulating layer 111a and covering at least a portion of the second wiring layer 112b, a fourth wiring layer 112d disposed on a side of the third insulating layer 111c opposite to a side of the third insulating layer 111c in which the second wiring layer 112b is embedded, a first wiring via 113a passing through the first insulating layer 111a and electrically connecting the first wiring layer 112a to the second wiring layer 112b, a second wiring via 113b passing through the second insulating layer 111b and electrically connecting the first wiring layer 112a to the third wiring layer 113c, and a third wiring via 113c passing through the third insulating layer 111c and electrically connecting the second wiring layer 112b to the fourth wiring layer 112d. Each of the first opening 130h and the second opening 180h may expose at least a portion of the fourth wiring layer 112d. Since the frame 110 may include a further large number of wiring layers 112a, 112b, 112c, and 112d, a connection structure 140 may be further simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be ABF or PID including an inorganic filler and an insulating resin. However, the materials of the first insulating layer 111a and the second and third insulating layers 111b and 111c are not limited thereto. Similarly, the first wiring via 113a passing through the first insulating layer 111a may have a diameter greater than those of the second and third wiring vias 113b and 113c passing through the second and third insulating layers 111b and 111c, respectively. The first wiring via 113a may have an hourglass shape or a cylindrical shape, while the second and third connection via layers 113b and 113c may have tapered shapes of which directions are opposite to each other. A thickness of each of the wiring layers 112a, 112b, 112c, and 112d may be greater than that of each of the redistribution layers 142. Other contents, including a material or a role of the first to fourth wiring layers 112a, 112b, 112c, and 112d and the first to third wiring vias 113a, 113b, and 113c, overlap those described above with reference to FIGS. 9 to 12, and a detailed description thereof is thus omitted.

Figure 14:
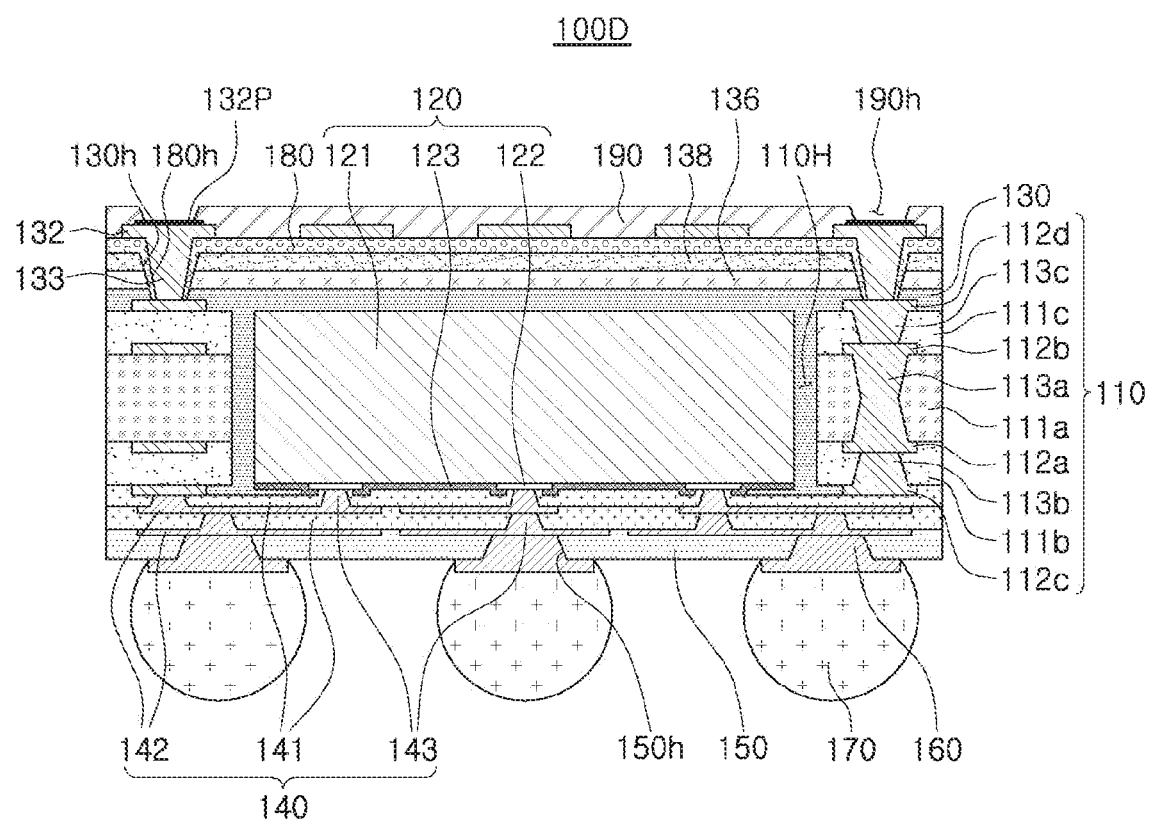
FIG. 14 illustrates another example of a fan-out semiconductor package.

FIG. 14 illustrates another example of a fan-out semiconductor package.

Referring to FIG. 12, a fan-out semiconductor package 100D according to another example may further include a reinforcing layer 136 disposed between the encapsulant 130 and the insulating layer 180, and a resin layer 138 disposed between the reinforcing layer 136 and the insulating layer 180, in comparison with the fan-out semiconductor package 100C according to an example, described above. In other words, the fan-out semiconductor package 100D according to another example may have a form in which the encapsulant 130, the reinforcing layer 136, the resin layer 138, and the insulating layer 180 are sequentially stacked. Other contents overlap those described above with reference to FIGS. 9 to 13, and a detailed description thereof is thus omitted.

Figure 15:
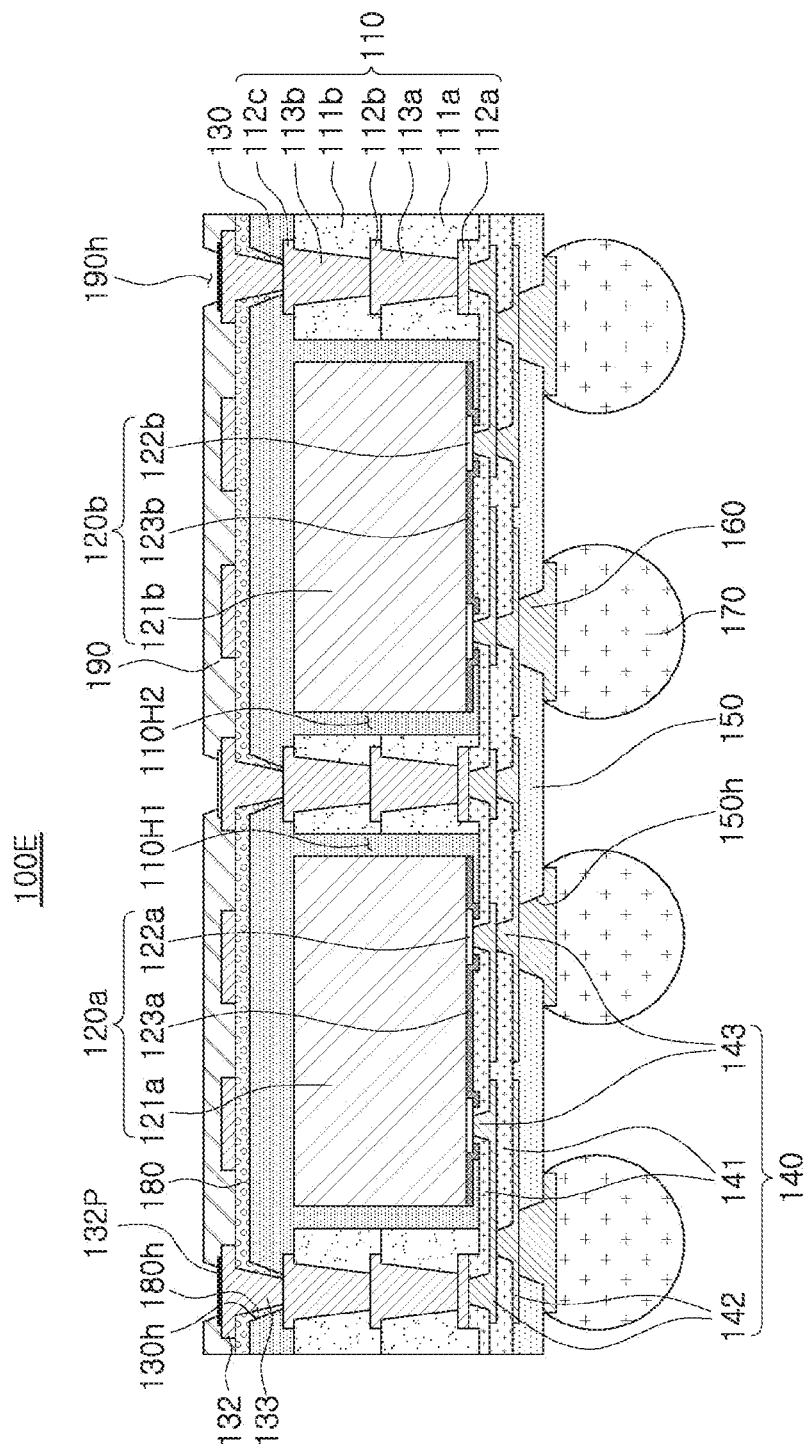
FIG. 15 illustrates another example of a fan-out semiconductor package.

FIG. 15 illustrates another example of a fan-out semiconductor package.

Referring to FIG. 15, in a fan-out semiconductor package 100E according to another example, in comparison with the fan-out semiconductor package 100A according to an example, described above, a frame 110 has a plurality of through-holes 110H1 and 110H2, and a first semiconductor chip 120a and a second semiconductor chip 120b may be disposed in through-holes 110H1 and 110H2, respectively. The first semiconductor chip 120a and the second semiconductor chip 120b may be an integrated circuit (IC) die, including bodies 121a and 121b, connection pads 122a and 122b, as well as passivation films 123a and 123b, respectively. As an example without a limitation, the first semiconductor chip 120a may be an application processor (AP), and the second semiconductor chip 120b may be a power management integrated circuit (PMIC), but is not limited thereto. The first semiconductor chip 120a and the second semiconductor chip 120b may be electrically connected to each other through the redistribution layer 142 of the connection structure 140. Other contents overlap those described above with reference to FIGS. 9 to 14, and a detailed description thereof is thus omitted.

Figure 16:
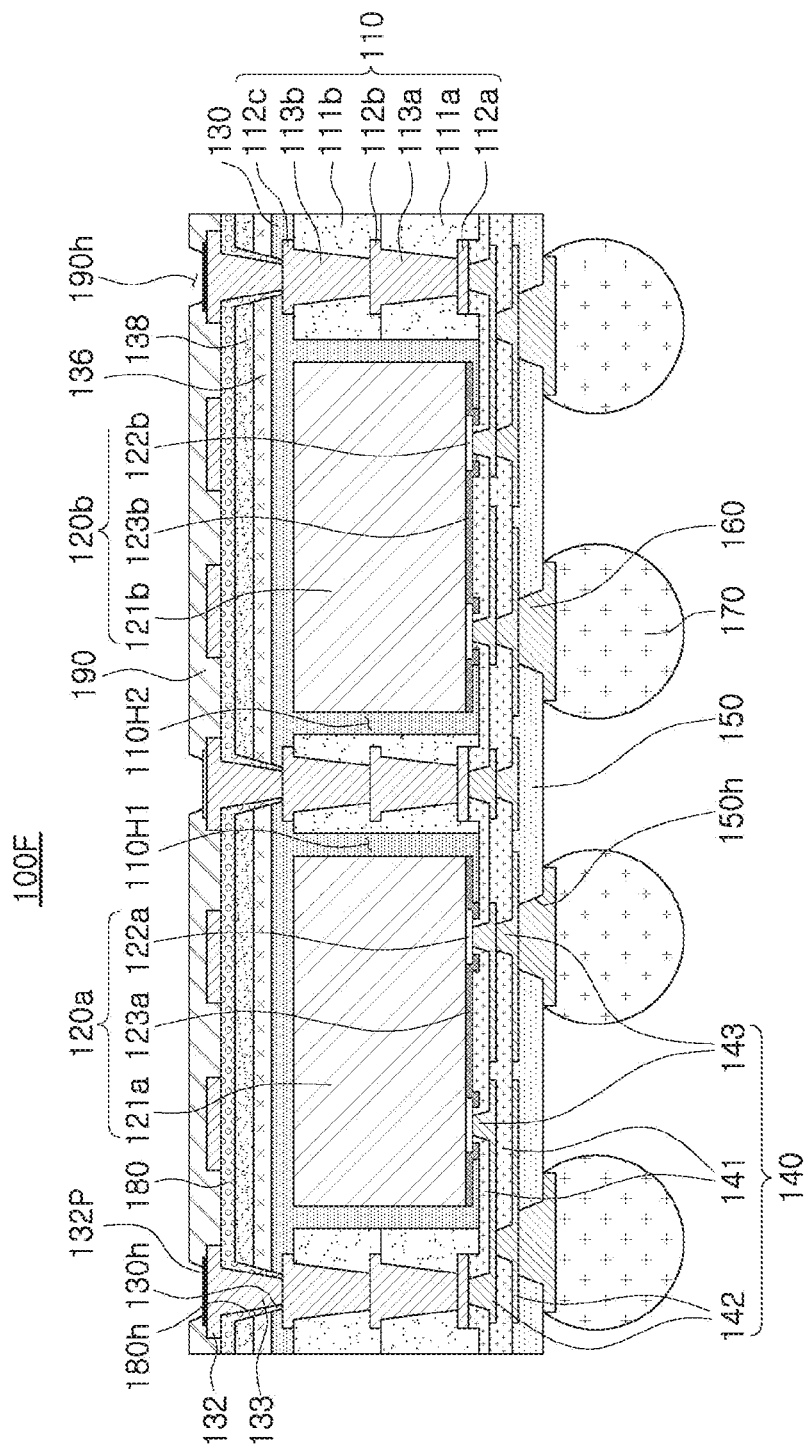
FIG. 16 illustrates another example of a fan-out semiconductor package.

FIG. 16 illustrates another example of a fan-out semiconductor package.

Referring to FIG. 16, in a fan-out semiconductor package 100F according to another example, in comparison with the fan-out semiconductor package 100B according to an example, described above, a frame 110 has a plurality of through-holes 110H1 and 110H2, and a first semiconductor chip 120a and a second semiconductor chip 120b may be disposed in through-holes 110H1 and 110H2, respectively. Other contents overlap those described above with reference to FIGS. 9 to 15, and a detailed description thereof is thus omitted.

As set forth above, according to an exemplary embodiment, a fan-out semiconductor package, in which selection of a material of an encapsulant is wide, and effects of moisture absorption or chemicals are reduced to improve reliability of a conductive via, may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
a frame, including a wiring layer, and having a through-hole;
a semiconductor chip disposed in the through-hole, and having an active surface on which a connection pad is disposed and an inactive surface opposite to the active surface;
an encapsulant covering at least a portion of each of the frame and the inactive surface of the semiconductor chip, and having a first opening exposing at least a portion of the wiring layer;
an insulating layer disposed on the encapsulant, and having a second opening formed in the first opening to expose at least a portion of the wiring layer;
a conductive pattern layer disposed on the insulating layer;
a conductive via disposed in the second opening, and electrically connecting the wiring layer to the conductive pattern layer; and
a connection structure disposed on the frame and the active surface of the semiconductor chip, and including one or more redistribution layers,
wherein the conductive pattern layer and the redistribution layer are electrically connected to the connection pad.

2. The fan-out semiconductor package of claim 1, wherein the insulating layer fills at least a portion between the first opening and the second opening.

3. The fan-out semiconductor package of claim 2, wherein the conductive via is spaced apart from the encapsulant by the insulating layer filling the portion of the first opening.

4. The fan-out semiconductor package of claim 1, wherein the encapsulant and the insulating layer have different physical properties.

5. The fan-out semiconductor package of claim 4, wherein the encapsulant includes a non-photosensitive insulating material, and
the insulating layer includes a photosensitive insulating material.

6. The fan-out semiconductor package of claim 4, wherein the encapsulant and the insulating layer are non-photosensitive insulating layers having different physical properties.

7. The fan-out semiconductor package of claim 1, further comprising: a reinforcing layer disposed between the encapsulant and the insulating layer,
wherein the first opening passes through the reinforcing layer, and
the reinforcing layer has an elastic modulus greater than an elastic modulus of each of the encapsulant and the insulating layer.

8. The fan-out semiconductor package of claim 7, wherein the conductive via is spaced apart from the reinforcing layer by the insulating layer filling the portion of the first opening.

9. The fan-out semiconductor package of claim 7, wherein the reinforcing layer includes a glass fiber, an inorganic filler, and an insulating resin.

10. The fan-out semiconductor package of claim 7, further comprising: a resin layer disposed between the reinforcing layer and the insulating layer,
wherein the first opening passes through the resin layer, and the reinforcing layer has an elastic modulus greater than an elastic modulus of the resin layer.

11. The fan-out semiconductor package of claim 10, wherein the conductive via is spaced apart from the resin layer by the insulating layer filling the portion of the first opening.

12. The fan-out semiconductor package of claim 1, further comprising: a cover layer disposed on the insulating layer, and having a third opening exposing at least a portion of the conductive pattern layer.

13. The fan-out semiconductor package of claim 12, wherein a surface treatment layer is disposed on a surface of the conductive pattern layer exposed by the third opening of the cover layer.

14. The fan-out semiconductor package of claim 1, wherein the frame includes a first insulating layer in contact with the connection structure, a first wiring layer in contact with the connection structure and embedded in the first insulating layer, a second wiring layer disposed on a side of the first insulating layer opposite to a side of the first insulating layer in which the first wiring layer is embedded, a second insulating layer disposed on a side of the first insulating layer opposite to a side of the first insulating layer in which the first wiring layer is embedded and covering at least a portion of the second wiring layer, a third wiring layer disposed on a side of the second insulating layer opposite to a side of the second insulating layer in which the second wiring layer is embedded, a first wiring via passing through the first insulating layer and electrically connecting the first wiring layer to the second wiring layer, and a second wiring via passing through the second insulating layer and electrically connecting the second wiring layer to the third wiring layer.

15. The fan-out semiconductor package of claim 14, wherein the wiring layer exposed by the first opening and the second opening is a portion of the third wiring layer.

16. The fan-out semiconductor package of claim 1, wherein the frame includes a first insulating layer, a first wiring layer disposed on one side of the first insulating layer, a second wiring layer disposed on the other side of the first insulating layer, a second insulating layer disposed on one side of the first insulating layer and covering at least a portion of the first wiring layer, a third wiring layer disposed on a side of the second insulating layer opposite to a side of the second insulating layer in which the first wiring layer is embedded, a third insulating layer disposed on the other side of the first insulating layer and covering at least a portion of the second wiring layer, a fourth wiring layer disposed on a side of the third insulating layer opposite to a side of the third insulating layer in which the second wiring layer is embedded, a first wiring via passing through the first insulating layer and electrically connecting the first wiring layer to the second wiring layer, a second wiring via passing through the second insulating layer and electrically connecting the first wiring layer to the third wiring layer, and a third wiring via passing through the third insulating layer and electrically connecting the second wiring layer to the fourth wiring layer.

17. The fan-out semiconductor package of claim 16, wherein the wiring layer exposed by the first opening and the second opening is a portion of the fourth wiring layer.

18. A fan-out semiconductor package, comprising:
a first connection structure including one or more redistribution layers;
a second connection structure disposed on the first connection structure, and having an electrical connection member electrically connected to the redistribution layer;
a semiconductor chip disposed on the first connection structure, and having a connection pad electrically connected to the one or more redistribution layers;
an encapsulant disposed on the first connection structure, covering at least a portion of each of the second connection structure and the semiconductor chip, and having a first opening exposing at least a portion of the electrical connection member; and
an insulating layer disposed on the encapsulant, and having a second opening formed in the first opening to expose at least a portion of the electrical connection member,
wherein the encapsulant and the insulating layer include different materials.

19. The fan-out semiconductor package of claim 18, wherein the insulating layer covers a wall surface of the first opening.

* * * * *